(12) United States Patent
Kang

(10) Patent No.: US 10,363,556 B2
(45) Date of Patent: Jul. 30, 2019

(54) AUTOMATED EXPERIMENT APPARATUS AND AUTOMATED EXPERIMENT METHOD USING THE SAME

(71) Applicant: Do Won Kang, Bucheon-si (KR)

(72) Inventor: Do Won Kang, Bucheon-si (KR)

( * ) Notice: Subject to any disclaimer, the term of this patent is extended or adjusted under 35 U.S.C. 154(b) by 245 days.

(21) Appl. No.: 15/631,622

(22) Filed: Jun. 23, 2017

(65) Prior Publication Data

US 2018/0257067 A1    Sep. 13, 2018

Related U.S. Application Data

(60) Provisional application No. 62/468,853, filed on Mar. 8, 2017.

(51) Int. Cl.
| | |
|---|---|
| *B01L 1/02* | (2006.01) |
| *B01J 3/02* | (2006.01) |
| *B01J 3/03* | (2006.01) |
| *B01J 3/04* | (2006.01) |
| *B01J 19/00* | (2006.01) |
| *G05B 19/05* | (2006.01) |
| *H01J 37/18* | (2006.01) |

(52) U.S. Cl.
CPC .................. *B01L 1/025* (2013.01); *B01J 3/02* (2013.01); *B01J 3/03* (2013.01); *B01J 3/04* (2013.01); *B01J 19/0073* (2013.01); *G05B 19/058* (2013.01); *H01J 37/185* (2013.01); *B01J 2219/1209* (2013.01); *B01J 2219/1215* (2013.01)

(58) Field of Classification Search
None
See application file for complete search history.

(56) References Cited

U.S. PATENT DOCUMENTS

| | | | |
|---|---|---|---|
| 5,725,835 A | * | 3/1998 | Lautenschlager .......... B01J 3/04 422/129 |
| 6,097,015 A | | 8/2000 | McCullough et al. |
| 8,820,565 B2 | | 9/2014 | Akhund et al. |
| 9,132,406 B2 | | 9/2015 | Lautenschlager |

OTHER PUBLICATIONS

Extended European Search Report dated May 4, 2018 issued in corresponding European Patent Application No. 18160814.2.

\* cited by examiner

*Primary Examiner* — Kathryn Wright
(74) *Attorney, Agent, or Firm* — Fenwick & West LLP

(57) ABSTRACT

The present invention provides an automated experiment apparatus and an automated experiment method using the same for putting a sample into a pressure vessel and automatically performing a chemical and/or physical reaction of the sample under a predetermined temperature and pressure. According to the embodiments of the present disclosure, it is possible to automatically perform an experiment from the beginning to the end without intervention of an user. As a result, it is possible to prevent a risk of gas leakage and human exposure to a harmful gas due to a manual operation. The apparatus comprises a controller which is configured to automatically perform a reaction process under a predetermined temperature and pressure in a state in which a sample holding member is air-tightly fixed to a pressure vessel and the sample is accommodated in a sample receiving chamber of the pressure vessel.

18 Claims, 19 Drawing Sheets

(A-A)

(a)

(b)

AUTOMATED EXPERIMENT APPARATUS AND AUTOMATED EXPERIMENT METHOD USING THE SAME

CROSS-REFERENCE TO RELATED APPLICATION

This application claims priority under 35 U.S.C. § 119(e) to U.S. Patent Application Ser. No. 62/468,853 filed on Mar. 8, 2017, which is incorporated by reference herein in its entirety.

TECHNICAL FIELD

The present disclosure relates to an automated experiment apparatus and an automated experiment method using the same and, more specifically, to an apparatus and method for putting a sample into a pressure vessel and automatically performing a chemical and/or physical reaction of the sample under a predetermined temperature and pressure.

BACKGROUND

An apparatus for initiating and/or promoting a chemical and/or physical reaction on a sample by a microwave is known from U.S. Pat. No. 9,132,406. The apparatus includes a pressure vessel and the pressure vessel defines a reaction chamber. A sample is put into the reaction chamber for initiating and/or promoting chemical and/or physical high-pressure reaction on the sample. Furthermore, the pressure vessel includes an insulation lining (a so-called liner) which serves as an insulator of the pressure vessel to improve a thermal resistance of the pressure vessel. The insulation lining is preferably made of plastic, PTFE, ceramic or tantalum. In addition, the insulation lining serves for preventing an inner lining of the pressure vessel from being chemically contaminated and corroded by the reactant and/or product and protecting the inner lining of the pressure vessel.

Furthermore, a lid is provided above the pressure vessel and configured to open or close the pressure vessel. When the lid closes the pressure vessel, an upper portion of the pressure vessel and the lid are clamped by a clamp, thereby sealing the pressure vessel. More specifically, when the lid rests on the upper part of the pressure vessel, both clamp halves which together form the circular metal clamp, can be closed. When the two steel clamp halves are closed, they can be secured against each other by a bolt.

A thread of the bolt engages in an opposite thread formed in one of the two clamp halves so that the latter can be pulled against each other. A part of the thread of the bolt which projects beyond the opposite thread of one clamp half has a length such that the bolt is also thereby prevented from being screwed out in a direction away from the clamp. In this state, the bolt is manually rotated for locking the two clamp halves so that the lid and the pressure vessel are air-tightly fixed.

In the air-tightly fixed state, a gas is supplied into the reaction chamber to increase an internal pressure of the pressure vessel. In this time, a microwave is generated to heat the sample, thereby performing a reaction of the sample. After the reaction is terminated, the clamp is loosened by manually untightening the bolt and the sample is removed from the pressure vessel.

In such a conventional experiment apparatus, as explained above, after the sample is put into the pressure vessel the clamp should be air-tightly fixed by manually tightening the bolt and after the reaction is completed, the clamp should be loosened by manually untightening the bolt. Depending on a type of the sample, a gas harmful to a human body may be generated as a reaction product. As a result, this poses a problem in that an user may inhale the harmful gas when personally fixing and releasing the clamp.

Since the clamp is manually fixed, the applied force for tightening the bolt can vary each time. If the bolt is weekly tightened, the sealing of the pressure vessel may not be properly achieved. In the case where a reaction occurs in such a state that the pressure vessel is not properly sealed, the reaction may not be performed in the right way and a gas may be leaked from the pressure vessel. This circumstance may lead to disaster.

Further, during the reaction, depending on the type of materials used as a reactant, an acid material may be produced as a product. The produced acid material cause corrosion of parts and pipes for transporting gas provided inside the experiment apparatus. If such parts and pipes undergo corrosion, then the affected parts and pipes need to be replaced. However, since each parts and pipes are independently arranged inside the experiment apparatus, it would be difficult for an ordinary user to replace the parts and pipes which should be delicately dealt with.

SUMMARY

It is thus an objective of the invention to provide an automated experiment apparatus and an automated experiment method which are capable of automatically performing an experiment from beginning to end without a manual operation. As a result, according to the embodiments, a risk of gas leakage and human exposure to a harmful gas can be reduced. Furthermore, according to the embodiments, the parts and pipes for transporting gas can be easily replaced.

DETAILED DESCRIPTION

Specific embodiments for realizing an idea of the present disclosure will now be described in detail with reference to the accompanying drawings.

In describing the present disclosure, if it is determined that the specific descriptions of configurations or functions of the related art may make obscure the spirit of the present disclosure, the detailed descriptions thereof will be omitted.

When there is a description that one component is "connected", "coupled", "supplied", "transferred" or "brought into contact" to or with another component, it is to be understood that one component may be connected, coupled, supplied, transferred or brought into contact to or with another component either directly or through the intervention of a third component.

The terms used herein are used merely for the purpose of describing specific embodiments and are not intended to limit the present disclosure. A singular expression includes a plural expression unless explicitly mentioned otherwise.

In the subject specification, expressions such as "upper", "lower", "side" and the like are based on the drawings. If the orientation of a subject matter is changed, the expressions may also be changed accordingly.

Hereinafter, specific configurations of an automated experiment apparatus according to one embodiment of the present disclosure will be described in detail with reference to FIGS. 1 to 7.

Figure 1:
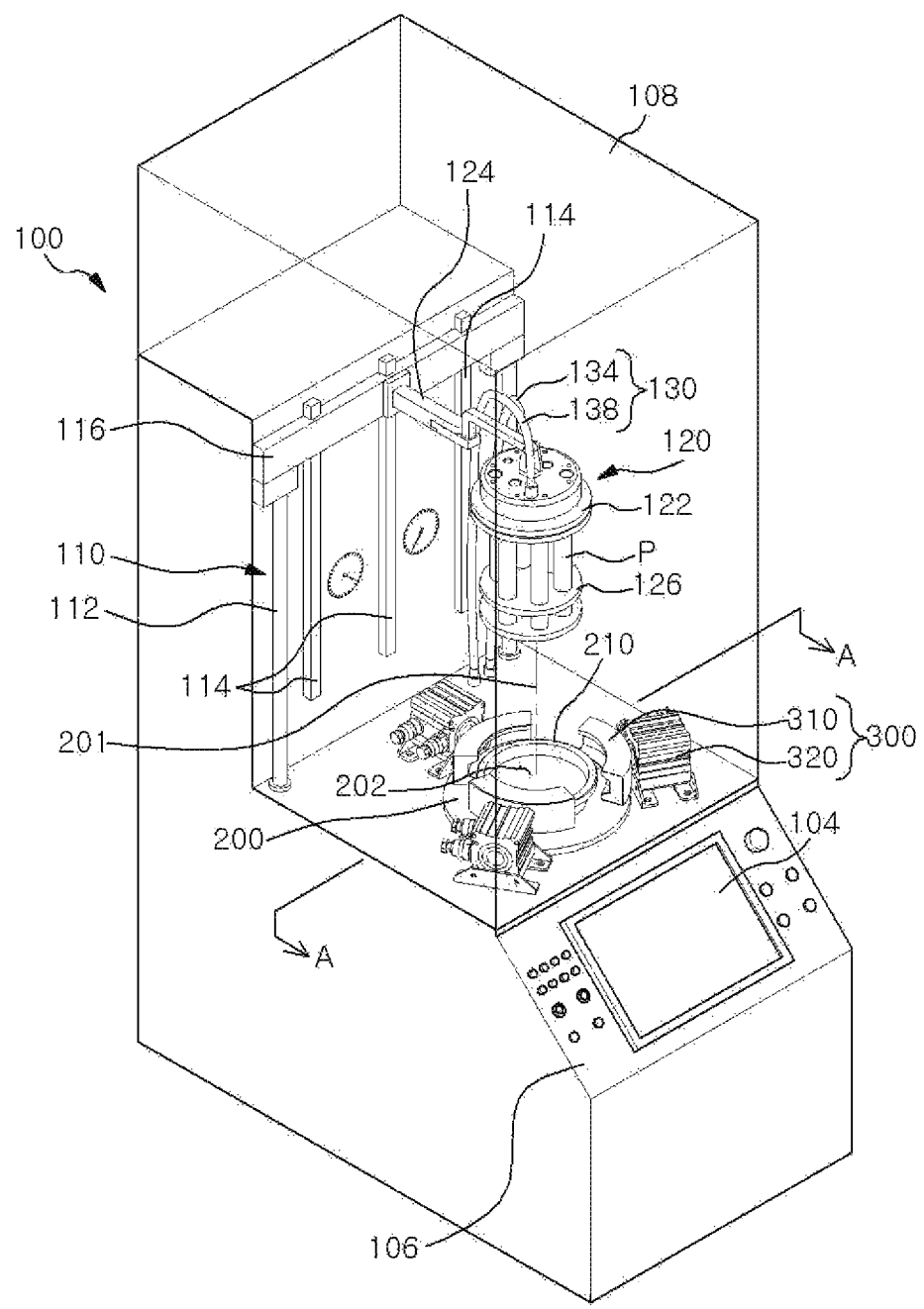
FIG. 1 is a perspective view of an automated experiment apparatus according to one embodiment of the present disclosure.
Figure 2:
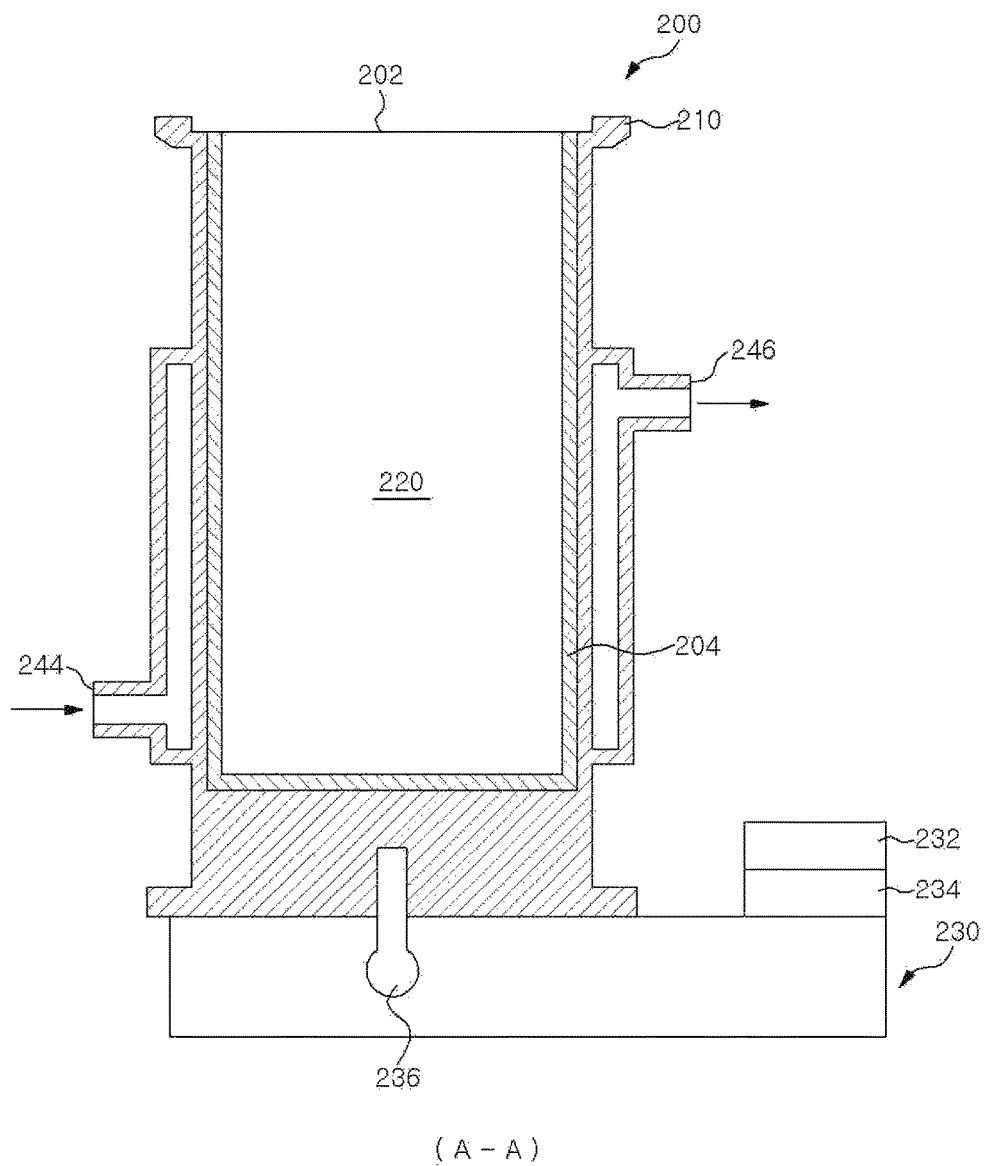
FIG. 2 is a schematic sectional view of the structure of a pressure vessel shown in FIG. 1.
Figure 3:
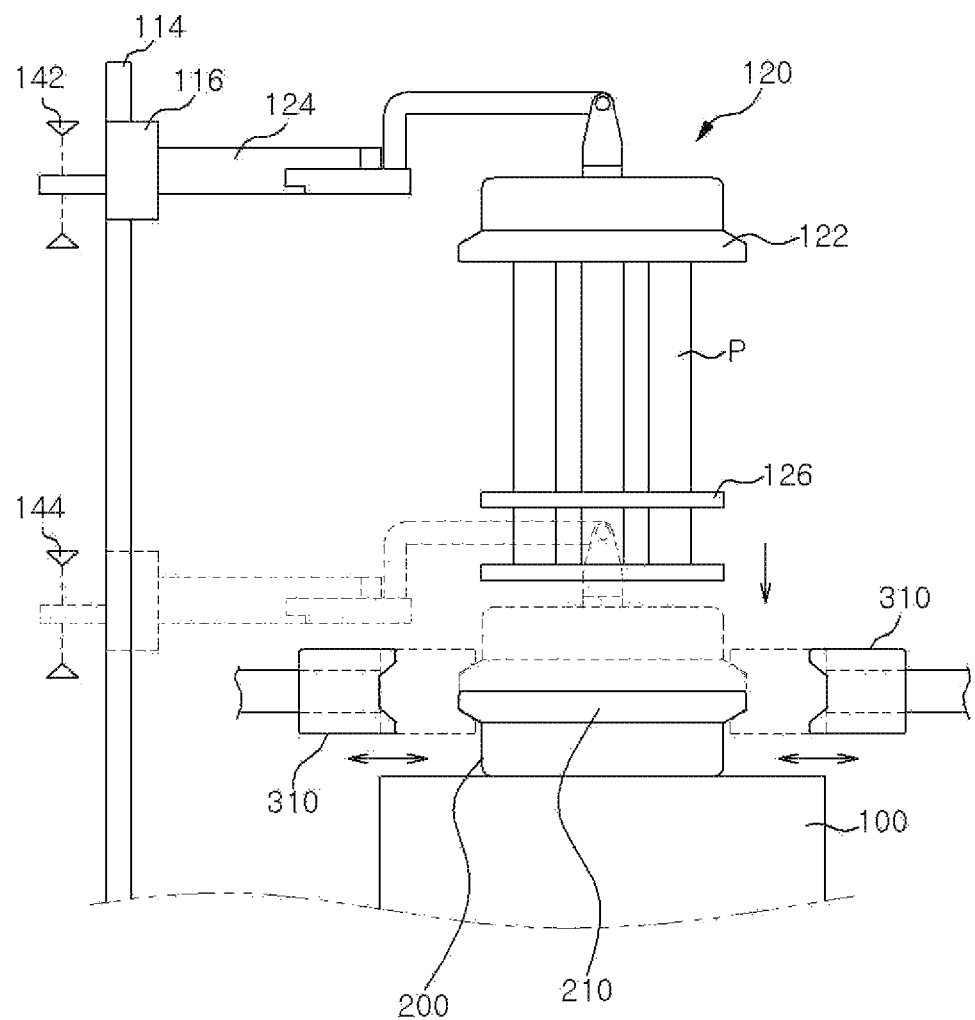
FIG. 3 is a partial side view of the automated experiment apparatus of FIG. 1.

Referring to FIGS. 1 to 3, the automated experiment apparatus 10 according to one embodiment of the present disclosure may include a housing 100, a pressure vessel 200 provided inside the housing 100 and including a sample receiving chamber 220 (see FIG. 2), and a clamp 300 configured to selectively air-tightly fix a sample holding member 120 and the pressure vessel 200.

The housing 100 provides an outer shell of the automated experiment apparatus 10. The pressure vessel 200 is installed inside the housing 100. The automated experiment apparatus 10 may further include a display 104 disposed on the housing 100 and configured to display the current state of the apparatus 10 or other information to an user, and a user interface 106 disposed on the housing 100 and configured to receive an input from the user, generate an input signal and send it to a controller 400 shown in FIG. 7. A transparent window 108 is configured to cover an upper portion of the housing 100. The window 108 functions as a safety shield curtain capable of preventing leakage of a gas to the outside. The user interface 106 is positioned outside of the transparent window 108. While not shown in the drawings, a fan for discharging a gas may be installed inside the housing 100.

In the housing 100, there is provided the sample holding member 120 configured to hold a sample P to be accommodated within the sample receiving chamber 220 and selectively cover an upper end opening 202 of the pressure vessel 200. Further, in the housing, there are provided a moving unit 110 configured to vertically move the sample holding member 120, a gas transfer unit 130 connected to the sample holding member 120 and configured to transfer a gas into the pressure vessel 200 and a sensing unit 140.

The moving unit 110 is configured to vertically move the sample holding member 120 and provided on the front side of the housing 100. The moving unit 110 includes a lifter 112 configured to provide a driving force to move the sample holding member 120 vertically, a guide 114 configured to guide the vertical movement of the sample holding member 120, and a moving frame 116 connected to the sample holding member 120 and the lifter 112 and configured to be moved vertically by the lifter 112. The guide 114 is attached on the front side surface of the housing and extends vertically. The moving frame 116 is engaged with the guide 114. The vertical movement of the moving frame 116 is guided by the guide 114.

The lifter 112 is, for example, a hydraulic cylinder or a screw jack. In addition, any suitable member which can provide a driving force for vertically moving the sample holding member 120 may be used as the lifter 112. The guide 114 may be one or more bars installed on a wall surface of the housing 100 and formed to extend in a vertical direction. The moving frame 116 may have a bar shape and extend horizontally. The moving frame 116 is guided by the guide 114 when the lifter 112 is driven.

The sample holding member 120 may be vertically moved between an upper position and a lower position by the moving unit 110, as shown in FIG. 3. The term "upper position" used herein refers to the uppermost position to which the sample holding member 120 can be moved up with respect to the housing 100. The term "lower position" used herein refers to the lowermost position to which the sample holding member 120 can be moved down with respect to the housing 100.

The sample holding member 120 may include a holder flange 122 configured to make contact with the pressure vessel 200 at the lower position, a connection frame 124 configured to interconnect the moving frame 116 and the holder flange 122, and a sample holder 126 connected to the holder flange 122 and configured to hold the sample P.

The holder flange 122 is formed in a lower portion of the sample holding member 120. The holder flange 122 has a circular outer shape of the same radius as a vessel flange 210 of the pressure vessel 200. The connection frame 124 may extend from the upper surface of the sample holding member 120 and be connected to the center of the moving frame 116. The sample holder 126 is configured to hold the sample P provided as test tubes for accommodating a reactant therein. The sample holder 126 may include an upper disc having a plurality of holes into which the test tubes can be inserted, a lower disc having a plurality of recesses formed on an upper surface thereof and configured to accommodate the lower portions of the test tubes, and a central beam configured to interconnect the upper disc and the lower disc. Thus, the sample P may be held in the sample holder 126 as the test tubes are inserted into the holes of the upper disc and the lower portions of the test tubes are accommodated in the recesses of the lower disc.

Figure 7:
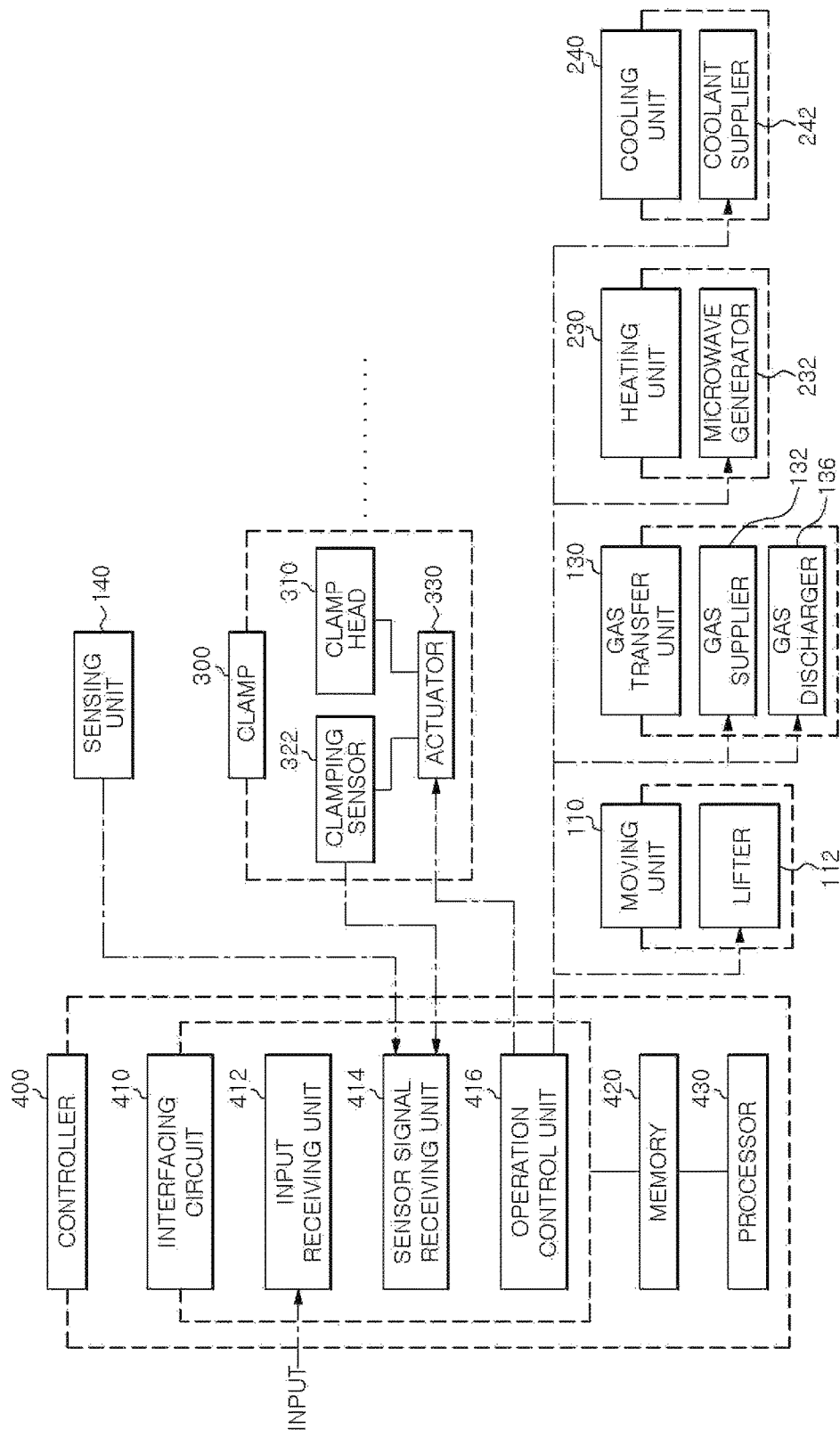
FIG. 7 is a control block diagram for explaining the control operation of the respective units of the automated experiment apparatus of FIG. 1.
Figure 8A:
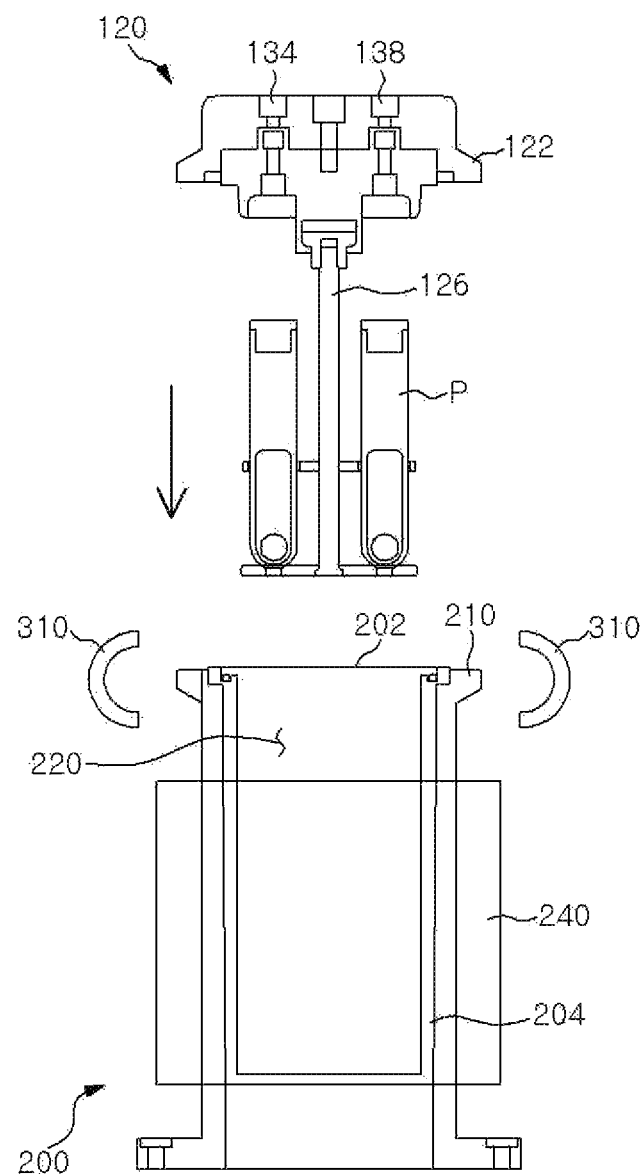
FIGS. 8A to 8H show each of the steps of an automated experiment method by using the automated experiment apparatus of FIG. 1.
Figure 8B:
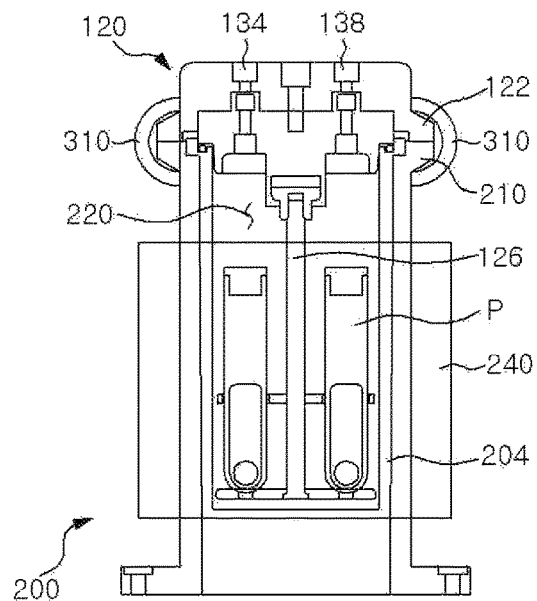
Figure 8C:
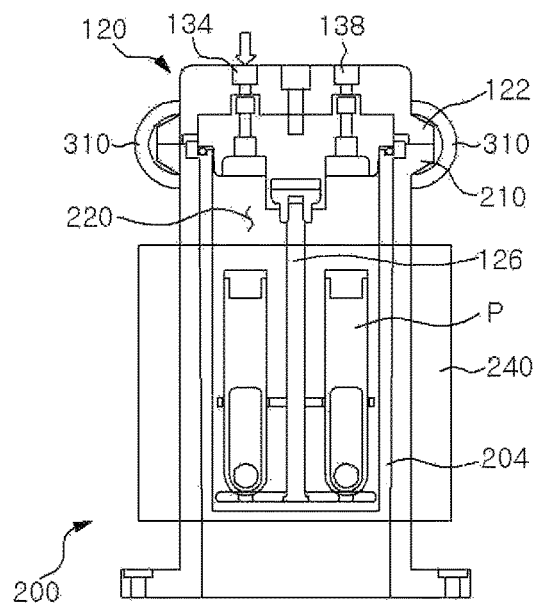
Figure 8D:
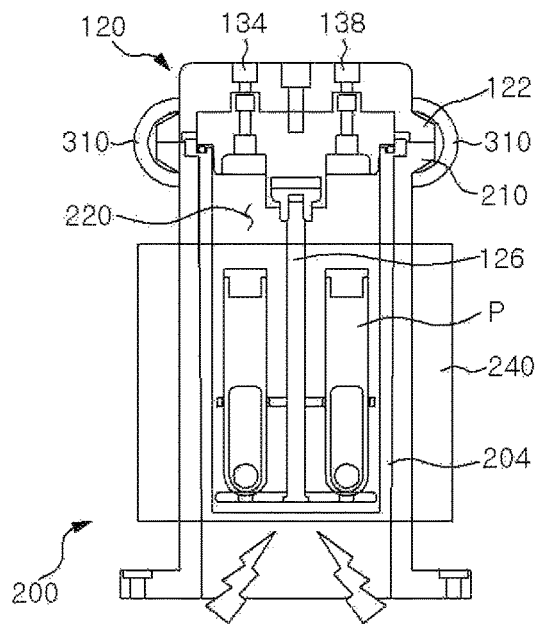
Figure 8E:
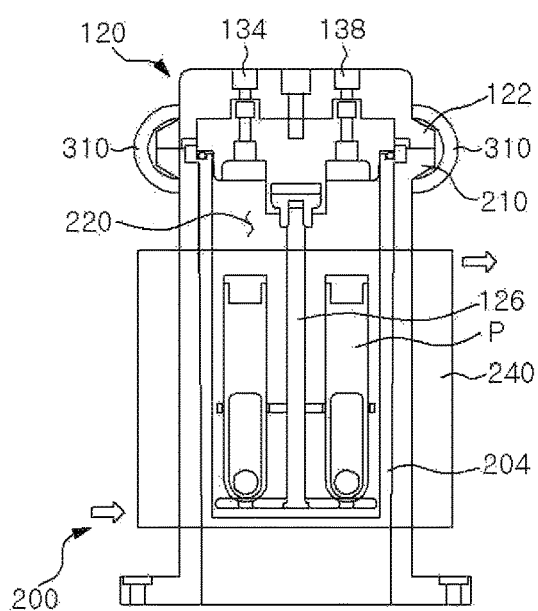
Figure 8F:
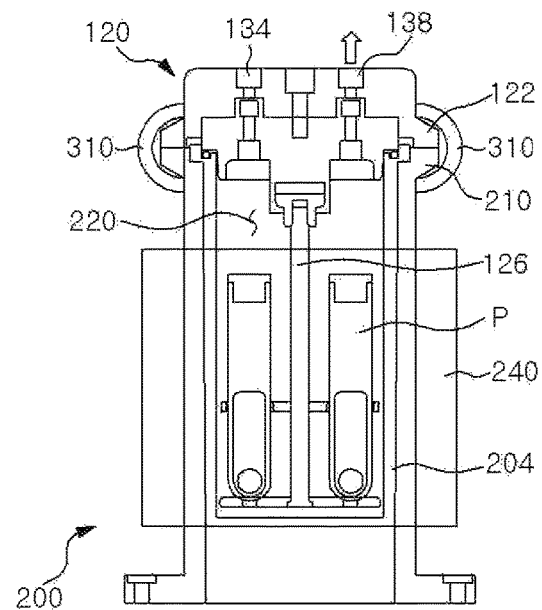
Figure 8G:
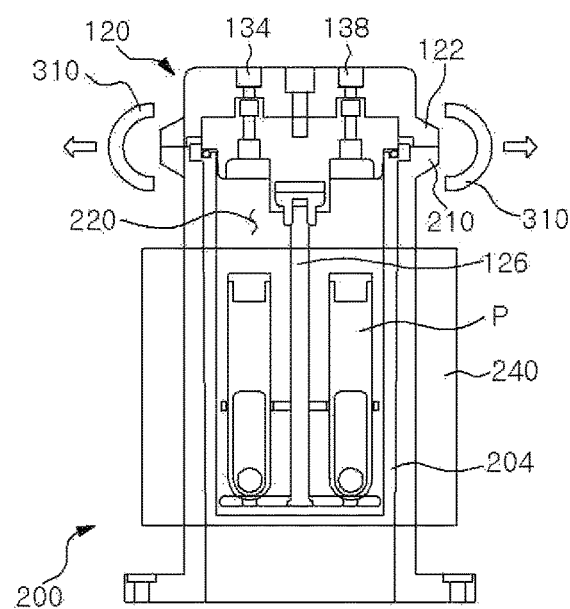
Figure 8H:
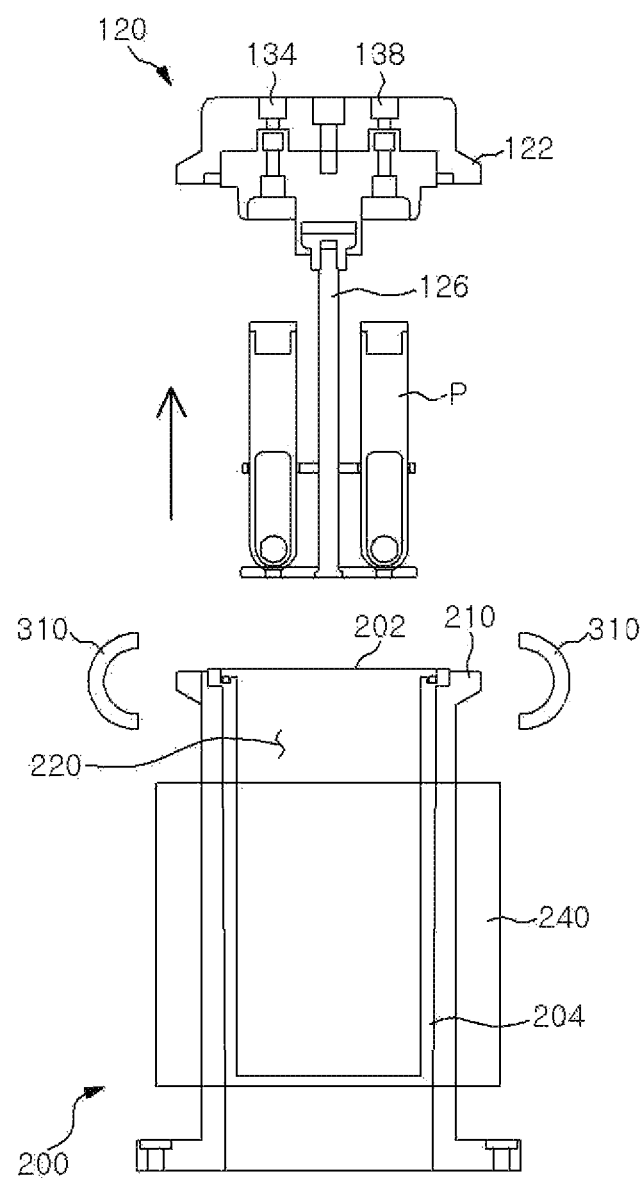

In FIGS. 1 and 7, the gas transfer unit 130 is configured to supply the gas, for example, a $N_2$ gas, into the pressure vessel 200. For this purpose, the gas transfer unit 130 includes a gas supplier 132 configured to supply the gas into the pressure vessel 200, a gas discharger 136 configured to discharge the gas from the pressure vessel 200, a gas supply line 134 connected at the opposite ends to the sample holding member 120 and the gas supplier 132, and a gas discharge line 138 connected at the opposite ends to the sample holding member 120 and the gas discharger 136.

Figure 12:
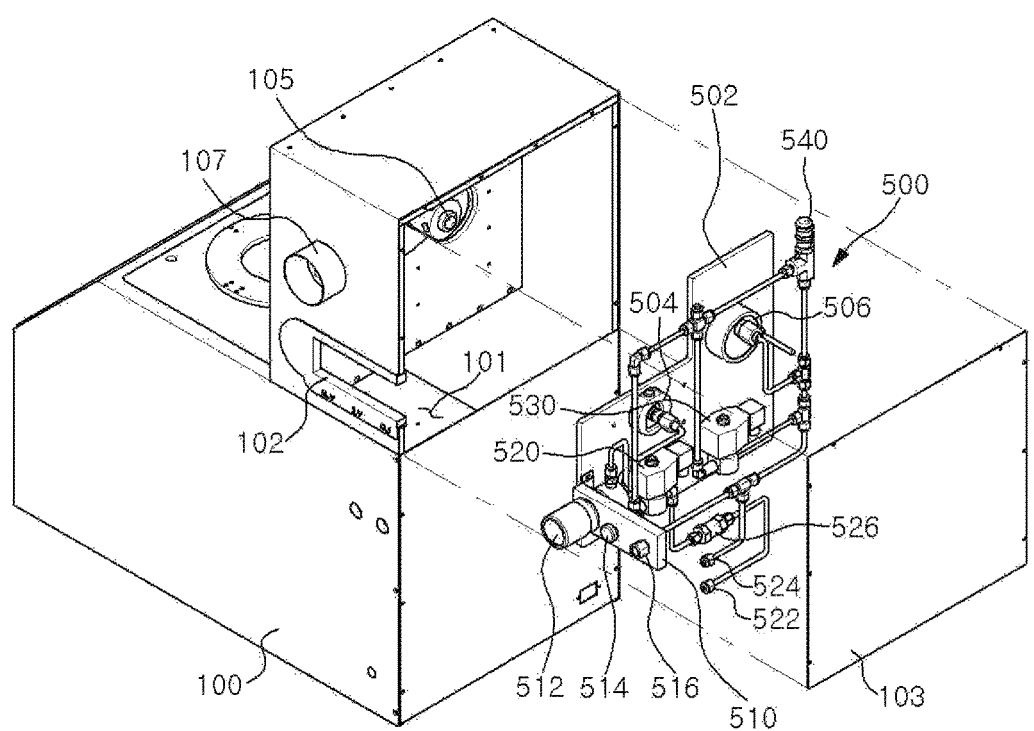
FIG. 12 is an exploded perspective view of the automated experiment apparatus of FIG. 1.
Figure 13:
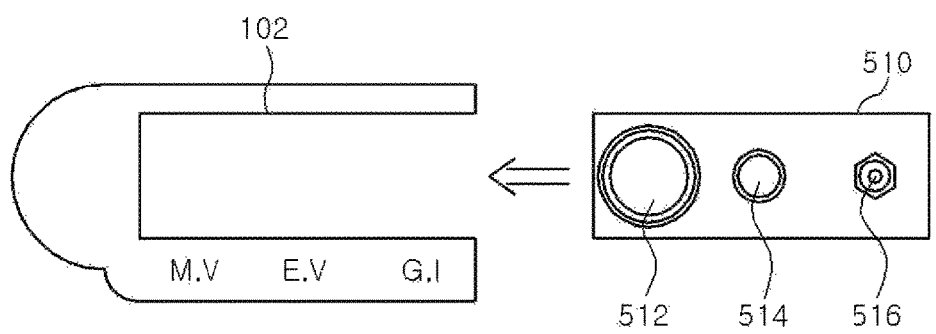
FIG. 13 shows steps for inserting a connecting block of the gas control module to a connecting groove of the housing of the automated experiment apparatus of FIG. 1.
Figure 13:
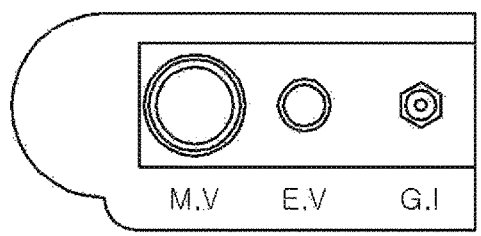

The gas supplier 132 and the gas discharger 136 may include a gas transfer means, and the gas transfer means is for example, a blower fan 105 (see FIG. 12) provided inside the housing 100. The gas supplier 132 may further include a separate storage container configured to store a specified gas to be supplied. The gas transfer means may be connected to the storage container so that the gas stored in the storage container can be supplied into the pressure vessel 200 via the gas supply line 134. The gas discharger 136 may further include a separate post-treatment means. The gas transfer means may be connected to the post-treatment means so that the gas existing in the pressure vessel 200 can be discharged to the post-treatment means via the gas discharge line 138.

The gas supplier 132 and the gas discharger 136 may be provided inside the housing 100. However, the present disclosure is not limited thereto. The gas supplier 132 and the gas discharger 136 may be separately provided outside the housing 100 and may be connected to the gas supply line 134 and the gas discharge line 138.

The gas supply line 134 and the gas discharge line 138 are connected at one end to the sample holding member 120 and are formed to extend to the lower surface of the sample holding member 120 through the sample holding member 120. Thus, the gas supply line 134 and the gas discharge line 138 communicate with the sample receiving chamber 220 inside the pressure vessel 200 when the sample holding member 120 is fastened to the pressure vessel 200 in an air-tight manner.

The sensing unit 140 includes an upper position sensor 142 configured to sense whether the sample holding member 120 is located at the upper position, a lower position sensor 144 configured to sense whether the sample holding member 120 is located at the lower position, a pressure sensor 146 configured to measure an internal pressure of the pressure vessel 200, and a temperature sensor 148 configured to measure an internal temperature of the pressure vessel 200.

The upper position sensor 142 and the lower position sensor 144 are respectively installed in a position corresponding to the upper position of the moving frame 116 and a position corresponding to the lower position of the moving frame 116. The upper position sensor 142 and the lower position sensor 144 may be, for example, a magnetic sensor. When the moving frame 116 is located in a predetermined upper position or lower position, a contact point provided in the moving frame 116 makes contact with a magnet disposed at the upper position or the lower position, whereby an electric current flows through the contact point. An electrical signal thus generated is transmitted to a controller 400 (see FIG. 7) so that the position of the moving frame 116 can be detected.

The pressure vessel 200, which is a cylindrical container, may be made of a material capable of resisting a high temperature and a high pressure. The pressure vessel 200 has an opening 202 formed in the upper surface thereof. An inner lining 204 of the pressure vessel 200 is made of a rigid material having a superior heat resistance such as Teflon which has superior heat and acid resistance.

The pressure vessel 200 further includes the vessel flange 210 provided as the upper end portion of the pressure vessel 200 so as to surround the opening 202. The vessel flange 210 has a circular outer shape with a radius about a central axis 201 of the pressure vessel 200.

The pressure vessel 200 further includes a heating unit 230 configured to heat the sample receiving chamber 220, and a cooling unit 240 configured to cool the sample receiving chamber 220 by circulating a coolant along the periphery of the sample receiving chamber 220.

As shown in FIG. 2, the heating unit 230 may include a microwave generator 232 configured to generate a microwave, a magnetron 234 configured to transfer the microwave generated in the microwave generator 232 to the sample receiving chamber 220, and an antenna 236 connected to the sample receiving chamber 220 and configured to transmit the microwave guided by the magnetron 234 to the sample receiving chamber 220.

The cooling unit 240 may include a coolant supplier 242 configured to store and supply a coolant. In the pressure vessel 200, there may be formed a coolant inlet 244 for supplying the coolant to a coolant circulation line connected to the coolant supplier 242 and provided to surround the outer surface of the pressure vessel 200 and a coolant outlet 246 for recovering the coolant discharged from the coolant circulation line.

Figure 4:
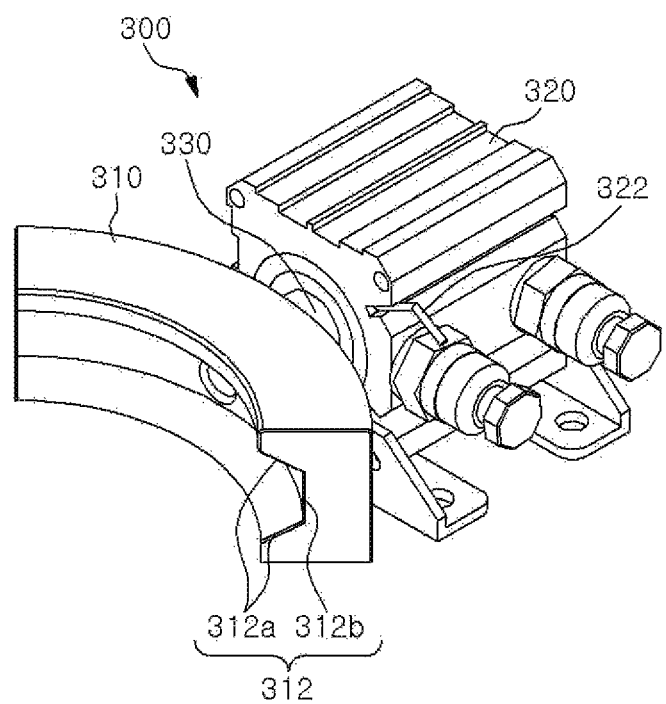
FIG. 4 is a perspective view of the clamp shown in FIG. 1.
Figure 5:
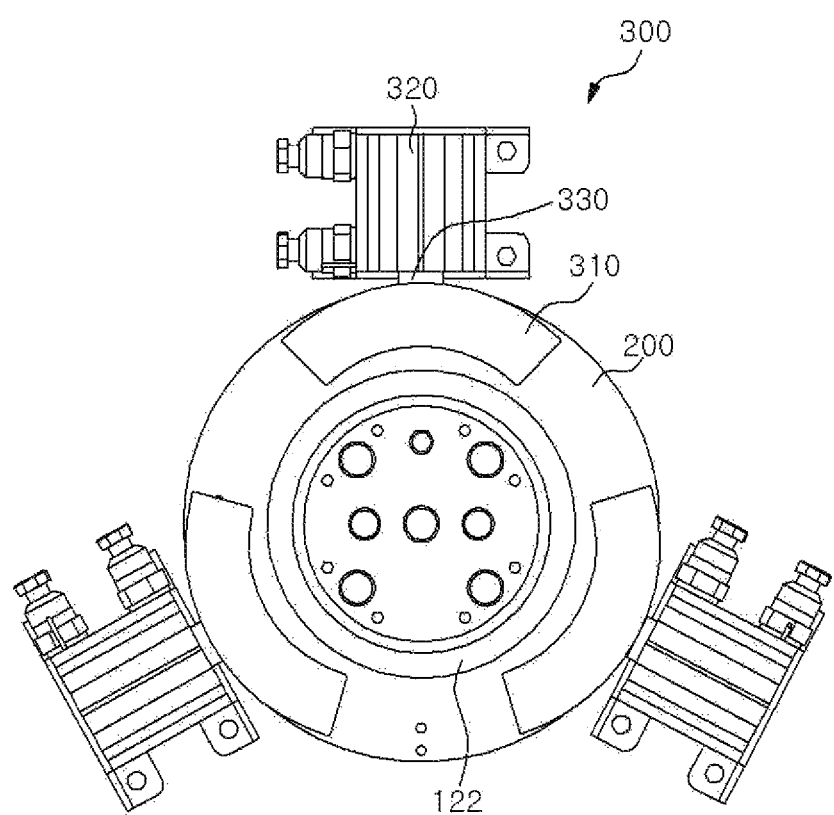
FIG. 5 is a plan view showing a state in which a cover and the pressure vessel are not clamped by the clamp shown in FIG. 1.
Figure 6:
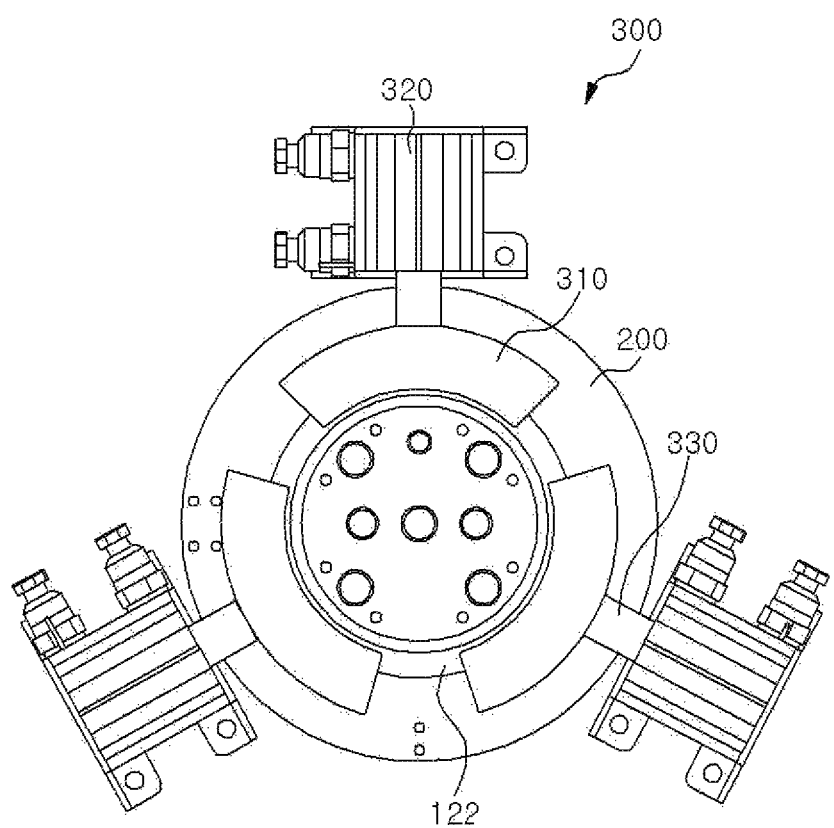
FIG. 6 is a plan view showing a state in which the cover and the pressure vessel are clamped by the clamp shown in FIG. 1.

Referring to FIGS. 4 to 6, the clamp 300 is provided to selectively air-tightly engage the holder flange 122 of the sample holding member 120 and the vessel flange 210 of the pressure vessel 200. The clamp 300 may include a clamp body 320, a clamp head 310 and an actuator 330 connected to the clamp head 310. The clamp head 310 includes a groove 312 configured to engage with the holder flange 122 and the vessel flange 210. The actuator 330 actuates the clamp head 310 to make the clamp head to move in a radial direction of the vessel flange 210. When the clamp head 310 moves toward the vessel flange 210 and the holder flange 122, the groove 312 is engaged with the holder flange 122 and the vessel flange 210 together so that the holder flange 122 and the vessel flange 210 are air-tightly fixed to each other. When the clamp head 310 moves back from the vessel flange 210 and the holder flange 122, the groove 312 is disengaged from the holder flange 122 and the vessel flange 210 so that the holder flange 122 and the vessel flange 210 are not fixed to each other. For example, the actuator 330 may be one of a hydraulic cylinder, a screw jack or the like.

In this embodiment, the holder flange 122 and the vessel flange 210 may have a ring shape and the clamp head 310 may have an arc shape. The clamp 300 may be a C-type clamp as the groove 312 has a C-like vertical cross section. Specifically, the vertical cross section of the groove 312 may be defined by a vertical surface 312b and two slant surfaces 312a formed to obliquely extend from the upper and lower ends of the vertical surface 312b.

Slant surfaces are also formed in the edge portions of the holder flange 122 and the vessel flange 210 which correspond to the slant surfaces 312a of the clamp 300. In a state in which the slant surfaces of the holder flange 122 and the vessel flange 210 and the slant surfaces 312a of the clamp 300 are brought into contact with each other, the clamp head 310 further moves toward the holder flange 122 and the vessel flange 210, thereby compressing the holder flange 122 and the vessel flange 210 against each other. In this manner, the holder flange 122 and the vessel flange 210 can be air-tightly sealed.

Furthermore, a clamping sensor 322 configured to sense the position of the clamp head 310 may be provided to the clamp body 320. For example, the clamping sensor 322 is capable of accurately sensing a top dead point of the clamp head 310, at which the clamp head 310 is fully pushed out from the clamp body 320 by the actuator 330, as shown in FIG. 6, and a bottom dead point of the clamp head 310, at which the clamp head 310 is fully pulled into the clamp body 320 by the actuator 330, as shown in FIG. 5. For example, the clamping sensor 322 may be a magnetic sensor. When the clamp head 310 is located at the top dead point or the bottom dead point, a contact point provided in the end portion of a piston rod connected to the clamp head 310 is brought into contact with a magnet disposed in a relevant position inside the clamp body 320, whereby an electric current flows through the contact point. An electrical signal thus generated is transmitted to the sensor signal receiving unit 414 (see FIG. 7) so that the position of the moving frame 116 can be detected.

In the meantime, one or more clamps 300 are disposed around the opening 202 of the pressure vessel 200 and the clamp heads 310 thereof are configured to move toward or away from the pressure vessel 200. If a plurality of clamps 300 are provided, the clamps 300 are disposed around the pressure vessel 200 at predetermined interval so that a plurality of the clamp heads 310 can make contact with the holder flange 122 and the vessel flange 210 at multiple points. The clamp heads 310 are configured to move toward or back from the holder flange 122 and the vessel flange 210, thereby air-tightly fixing or unfixing the sample holding member 120 and the pressure vessel 200. In order to enhance the air-tightness of the sample holding member 120 and the pressure vessel 200, an elastic O-ring may be provided on the mutually-facing surface of the holder flange 122 and/or the vessel flange 210.

Referring to FIG. 7, the controller 400 is configured to automatically perform a reaction process under a predetermined temperature and pressure in a state in which the sample holding member 120 is air-tightly fixed to the pressure vessel 200 and a sample P is accommodated within the sample receiving chamber 220. The controller 400 comprises an interfacing circuit 410, a memory 420 and a processor 430. The interfacing circuit 410 is coupled to the processor 430, and the memory 420 is coupled to the processor 430.

The interfacing circuit 410 comprises an input receiving unit 412 configured to receive an input through the user interface 106, a sensor signal receiving unit 414 configured to receive sensor signals from various sensors including the upper position sensor 142, the lower position sensor 144, the pressure sensor 146, the temperature sensor 148 and the clamping sensor 322, and an operation control unit 416 coupled to the lifter 112 of the moving unit 110, the gas supplier 132 and the gas discharger 136 of the gas transfer unit 130, the microwave generator 232 of the heating unit 230, the coolant supplier 242 of the cooling unit 240 and the actuator 330 of the clamp 300.

The upper position sensor 142 is coupled to the sensor signal receiving unit 414 and configured to send a sensing signal of whether the sample holding member 120 is located at the upper position to the sensor signal receiving unit 414. The lower position sensor 144 is coupled to the sensor signal receiving unit 414 and configured to send a sensing signal of whether the sample holding member 120 is located at the lower position to the sensor signal receiving unit 414. The pressure sensor 146 is coupled to the sensor signal receiving unit 414 and configured to send a sensing signal of the internal pressure of the pressure vessel 200 to the sensor signal receiving unit 414. The temperature sensor 148 is coupled to the sensor signal receiving unit 414 and configured to send a sensing signal of the internal temperature of the pressure vessel 200 to the sensor signal receiving unit 414.

The operation control unit 416 is configured to send a control signal to the lifter 112 to move the moving frame vertically. The operation control unit 416 is further configured to send a control signal to the gas supplier 132 and the gas discharger 136 for supplying/discharging the gas into/from the pressure vessel 200. The operation control unit 416 is further configured to send a control signal to the microwave generator 232 for heating the pressure vessel 200. The operation control unit 416 is further configured to send a control signal to the coolant supplier 242 for cooling the pressure vessel 200. Moreover, the operation control unit 416 is further configured to send a control signal to the actuator 330 to move the moving frame 116 vertically.

Hereinafter, an automated experiment method for automatically performing an experiment using the automated experiment apparatus 10 configured as mentioned above will be described with reference to FIGS. 8A to 8H, 9A to 9C and 10.

Figure 9A:
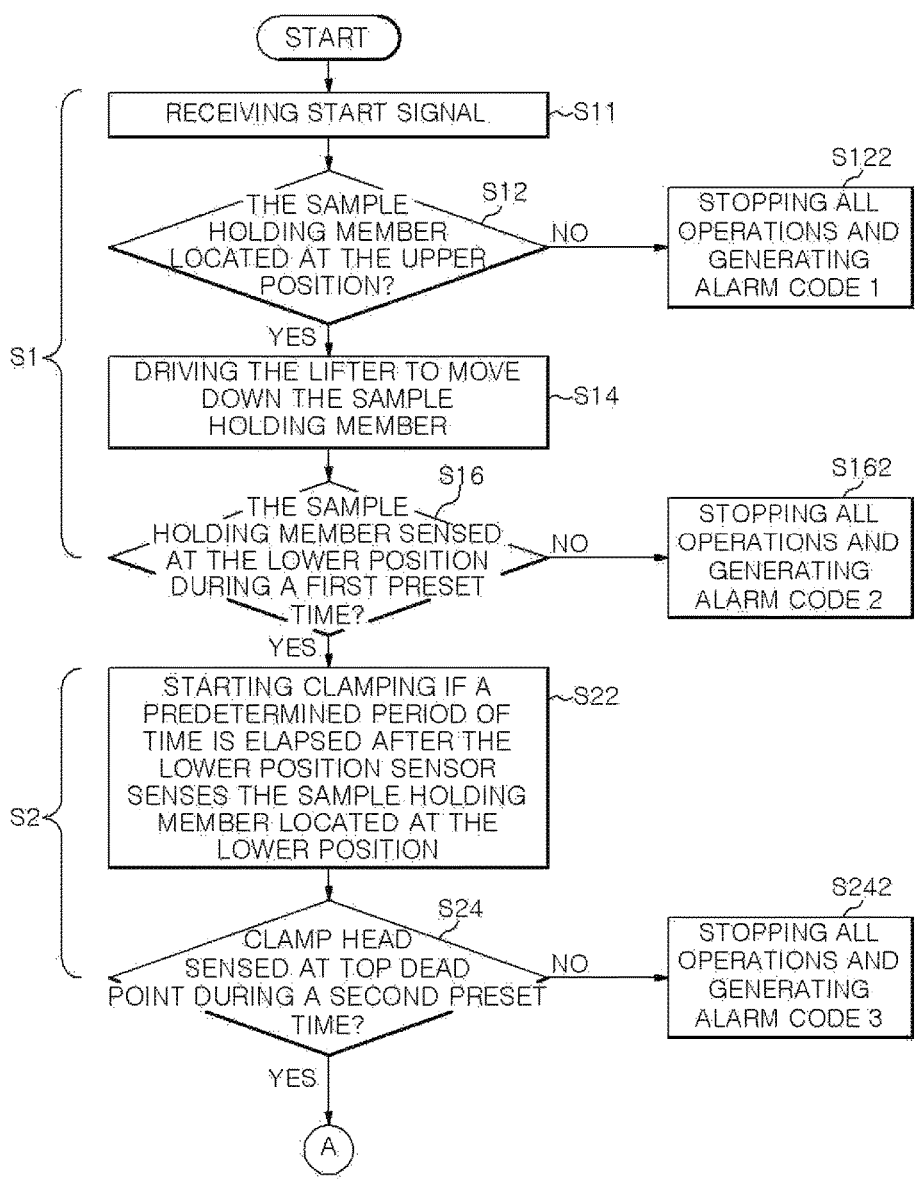
FIGS. 9A to 9C show flowcharts for explaining the automated experiment method using the automated experiment apparatus of FIG. 1.

As shown in FIG. 9A, the automated experiment method according to one embodiment of the present disclosure is started by a start signal input from an user through the user interface 106. Along with the input of the start signal, the user may input specific reaction conditions such as a reaction temperature, a reaction pressure and a reaction time. These reaction conditions may be pre-stored in the memory 420.

If the start signal is inputted through the user interface 106, the input receiving unit 412 of the controller 400 receives the start signal (S11). As the input receiving unit 412 receives the start signal, the controller 400 sends a control signal to the lifter 112 to move the sample holding member 120 down to the lower position.

Specifically, if the start signal is received by the input receiving unit 412 (S11), the controller 400 may determine whether the sample holding member 120 is sensed by the upper position sensor 142 (S12). If the upper position sensor 142 senses the sample holding member 120 being properly located at the upper position, the controller 400 sends a control signal to the lifter 112 and the lifter 112 is driven to move the sample holding member 120 downwardly (S14).

If the upper position sensor 142 fails to sense the sample holding member 120 being properly located at the upper position, the controller 400 stops all operations of the automated experiment apparatus 10 and generates alarm code 1 (S122). As a result, prior to starting the downward movement of the sample holding member 120, it become possible to determine whether the sample holding member 120 is located in the correct position before the downward movement is started. This makes it possible to prevent damage or erroneous operation of the apparatus which may occur when the downward movement of the sample holding member 120 is started from the wrong position due to an unexpected error.

The lifter 112 is controlled by the controller 400 to accurately generate a driving force at a predetermined magnitude and move the sample holding member 120 down to the lower position. The controller 400 verifies whether the sample holding member 120 is sensed by the lower position sensor 144 during a first preset time after the controller 400 sent a control signal to the lifter 112 to move down the sample holding member 120 (S16). If the lower position sensor 144 senses the sample holding member 120 being properly located at the lower position, the controller 400 sends control signals to the plurality of actuators 330.

If the lower position sensor 144 fails to sense the sample holding member 120 during the first preset time, the controller 400 stops all operations of the automated experiment apparatus 10 and generates alarm code 2 (S162). This makes it possible to prevent damage or erroneous operation of the apparatus which may occur when the holder flange 122 and the vessel flange 210 are clamped in a state in which the sample holding member 120 is not properly positioned at the lower position due to an unexpected error despite the provision of the predetermined driving force.

After the downward movement step (S1) is completed, the controller 400 sends control signals to the plurality of actuators 330, and the clamp heads 310 move transversely toward the holder flange 122 and the vessel flange 210 to engage the holder flange 122 and the vessel flange 210 (S2). As a result, the sample holding member 120 and the pressure vessel 200 are air-tightly fixed to each other.

Specifically, each of the clamp heads 310 of the clamps 300 begins to be pushed out from the corresponding clamp bodies 320 (S22). At this step, the clamps 300 are controlled to be operated synchronously. Further, in order to give a constant clamping force to the holder flange 122 and the vessel flange 210 every time the experiment is performed, the actuators 330 can be controlled to be stretched to a predetermined length.

The controller 400 verifies whether the clamp head 310 is sensed to be located at the top dead point by the clamping sensors 322 during a second preset time after the controller 400 sent control signals to the actuators 330 for stretching thereof (S24). If the clamping sensors 322 senses the clamp heads 310 at the top dead point, it is considered that the sample holding member 120 and the pressure vessel 200 have been air-tightly fixed completely.

If at least one of the clamping sensors 322 fails to sense the corresponding clamp head 310 at the top dead point during the second preset time, the controller 400 stops all operations of the automated experiment apparatus 10 and generates alarm code 3 (S242). This makes it possible to prevent damage of the apparatus or leakage of a harmful gas which may occur when the clamp heads 310 are not located at the predetermined top dead point due to an unexpected error and when a reaction is started in a state in which the air-tight fixing of the holder flange 122 and the vessel flange 210 by clamping is not fully achieved.

Figure 9B:
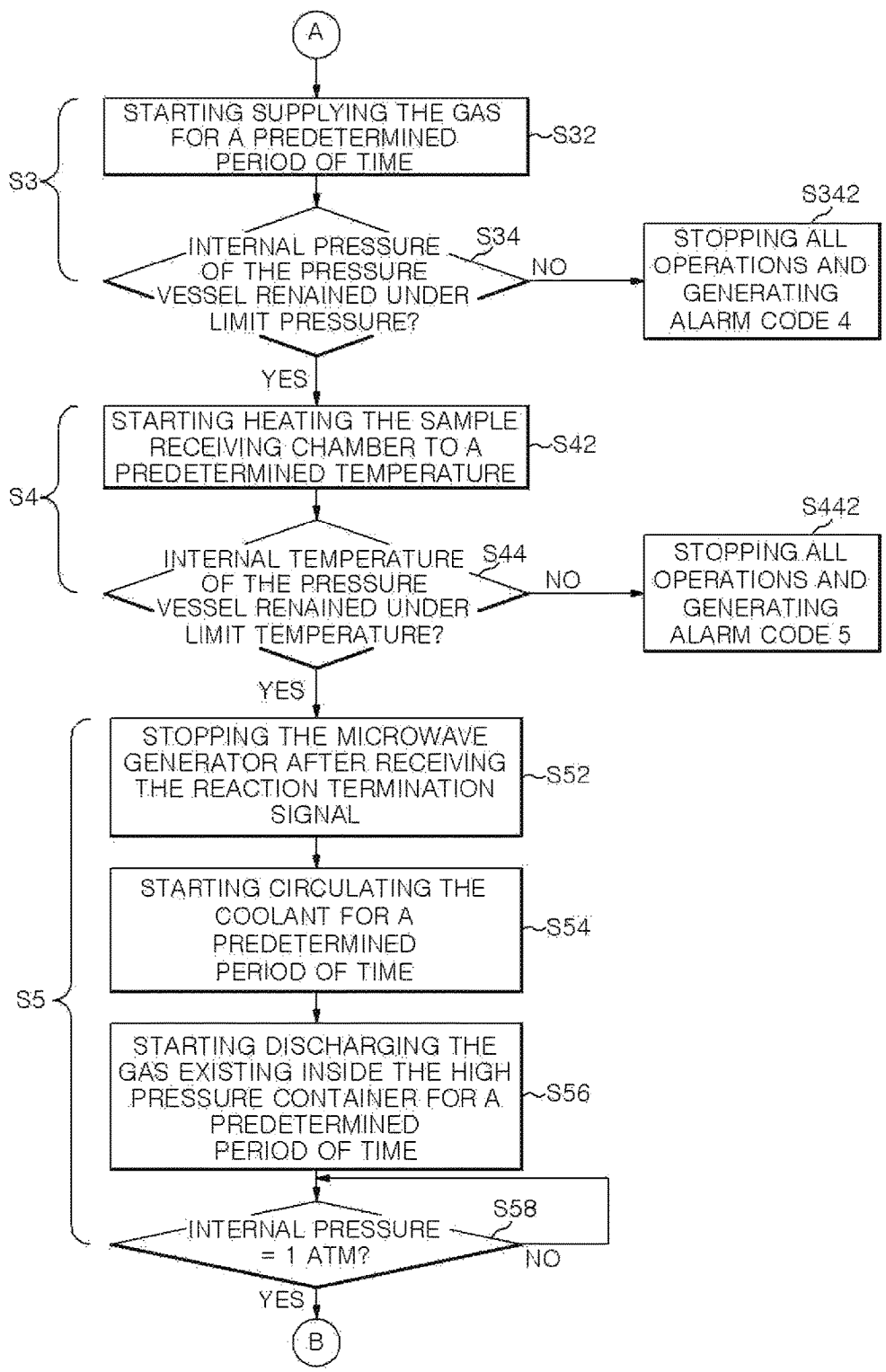

As shown in FIG. 9B, the gas supplier 132 is operated to supply a specified gas to the sample receiving chamber 220 (S3) after the clamping step (S2) is completed.

Specifically, the operation of the gas supplier 132 may be started to supply a specified gas into the pressure vessel 200 for a predetermined period of time (S32). The gas may be, for example, an $N_2$ gas.

The supply of the gas using the gas supplier 132 may be performed until the internal pressure of the pressure vessel 200 reaches a predetermined reaction pressure. For this purpose, the amount of the supply gas required for creating the predetermined reaction pressure may be automatically calculated according to an algorithm stored in the controller 400. The amount of the gas thus calculated may be supplied into the pressure vessel 200 via the gas supply line 134.

During supplying of the gas, the controller 400 determines whether the internal pressure of the pressure vessel 200 measured by the pressure sensor 146 is higher than a pressure limit (S34).

If the internal pressure of the pressure vessel 200 measured by the pressure sensor 146 exceeds the pressure limit, the controller 400 may stop all operations of the automated experiment apparatus 10 and may generate alarm code 4 (S342). This makes it possible to prevent breakage of the pressure vessel 200 which may occur when the internal pressure exceeds the pressure limit due to an unexpected error.

After the gas supply step (S3) is completed, a heating step (S4) for heating the sample receiving chamber 220 is started.

Specifically, after the supply of the gas is completed, the operation of the microwave generator 232 is started to transfer a microwave to the pressure vessel 200 via the antenna 236 for a predetermined period of time (S42). As a result, the internal temperature of the pressure vessel 200 gets higher. The interior of the pressure vessel 200 may be heated so that the internal temperature of the pressure vessel 200 reaches a predetermined reaction temperature. To that end, the amount of the microwave required for achieving the predetermined reaction temperature may be automatically calculated according to a specified algorithm stored in the controller 400.

When the pressure vessel 200 is heated by the microwave, the controller 400 may determine whether the internal temperature of the pressure vessel 200 measured by the temperature sensor 148 reaches a predetermined temperature limit (S44). In this regard, the temperature limit may be set at a threshold temperature above which explosion may occur inside the pressure vessel 200 by the sample P or other components inside the pressure vessel 200 may be damaged.

If the internal temperature of the pressure vessel 200 measured by the temperature sensor 148 reaches or exceeds the temperature limit, the controller 400 may stop all operations of the automated experiment apparatus 10 and may generate alarm code 5 (S442). After the heating step (S4) is completed and the reaction is terminated, the sample receiving chamber 220 is cooled by circulating a coolant through a circumference of the pressure vessel 200, and the gas is discharged from the sample receiving chamber 220 (S5).

Specifically, the reaction is terminated as the operation of the microwave generator 232 is stopped (S52). As the reaction is terminated, the coolant supplier 242 starts to operate and the coolant is supplied to and circulated along the periphery of the pressure vessel 200 for a predetermined period of time (S54). As the cooling is performed, the operation of the gas discharger 136 is started and the gas is discharged from the pressure vessel 200 via the gas discharge line 138 for a predetermined period of time (S56). At this time, the gas may be discharged until the internal pressure of the pressure vessel 200 reaches the atmospheric pressure (1 atm). This makes it possible to prevent occurrence of unnecessary explosion when the pressure vessel 200 is opened (S58).

Figure 9C:
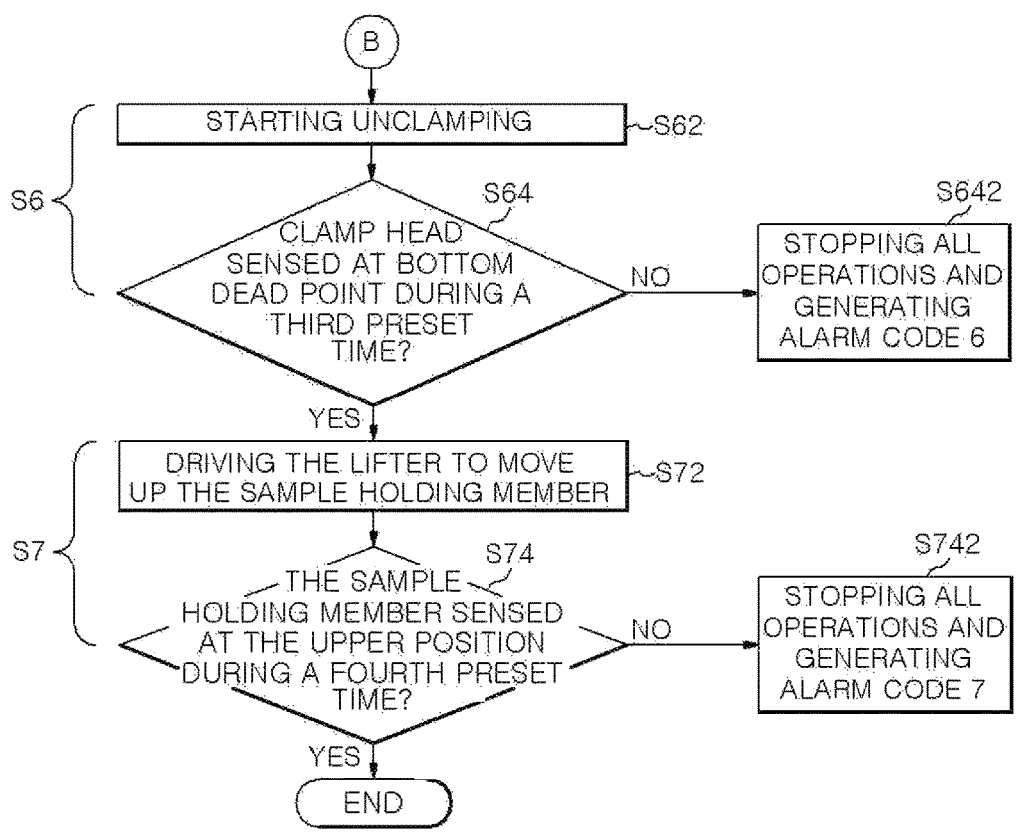
Figure 10:
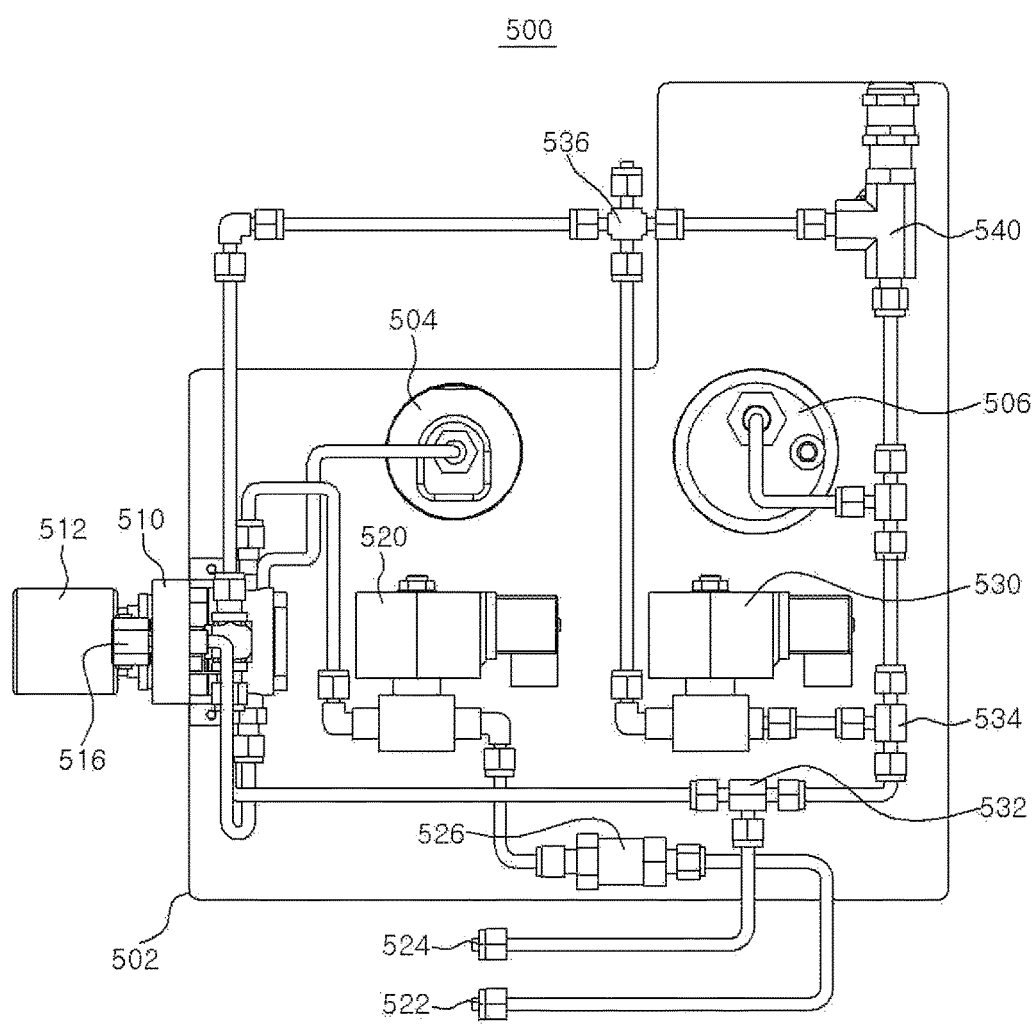
FIG. 10 is a gas control module of the automated experiment apparatus of FIG. 1.
Figure 11:
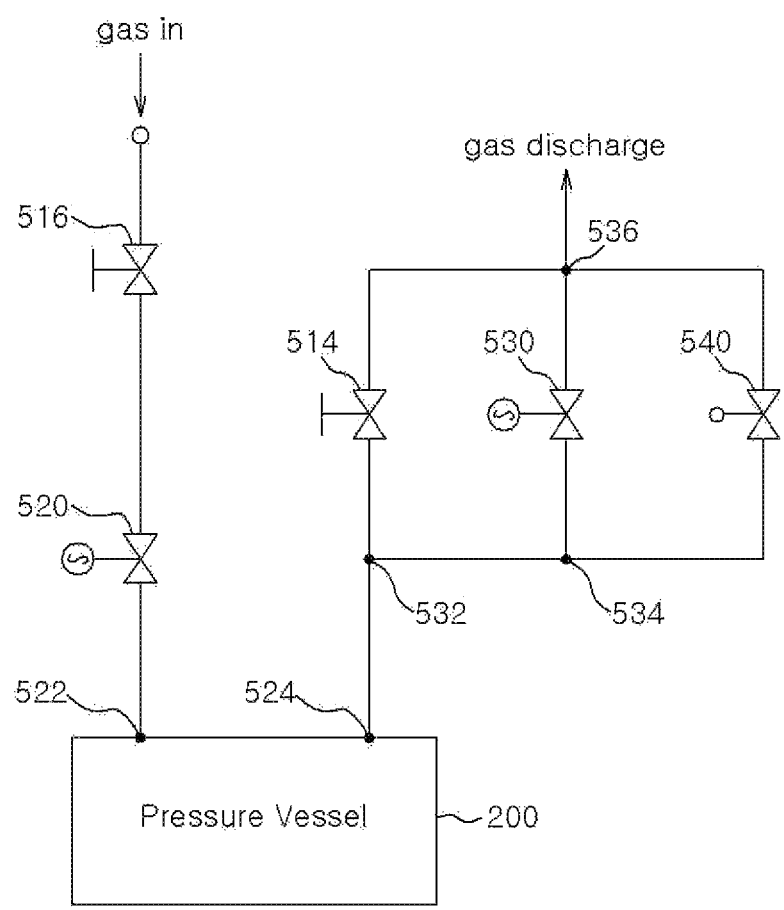
FIG. 11 is a circuit diagram of the gas control module of FIG. 10.

As shown in FIG. 9C, the holder flange 122 and the vessel flange 210 are unclamped (S6) after the cooling and gas discharging step (S5) is completed.

Specifically, each of the clamp heads 310 of the clamps 300 begins to be pulled into the corresponding clamp bodies 320 (S62). At this step, the clamps 300 are controlled to be operated synchronously. The actuators 330 can be controlled to be shrunk to a predetermined length.

The controller 400 verifies whether the clamp head 310 is sensed to be located at the bottom dead point by the clamping sensors 322 during a third preset time after the controller 400 sent control signals to the actuators 330 for shrinking thereof (S64). If the clamping sensors 322 senses the clamp heads 310 at the bottom dead point, it is considered that the sample holding member 120 and the pressure vessel 200 have been unfixed completely.

If at least one of the clamping sensors 322 fails to sense the corresponding clamp head 310 at the bottom dead point during the third preset time, the controller 400 stops all operations of the automated experiment apparatus 10 and generates alarm code 6 (S642). This makes it possible to prevent damage or erroneous operation of the apparatus which may occur when the clamp head 310 is not located at the predetermined bottom dead point due to an unexpected error and when the upward movement of the sample holding member 120 is started in a state in which the unclamping of the holder flange 122 and the vessel flange 210 is not fully achieved.

After the unclamping step (S6) is completed, the sample holding member 120 is moved up to the upper position by the lifter 112 (S7).

Specifically, the controller 400 controls the lifter 112 to move the sample holding member 120 upwardly (S72). In this way, the lifter 112 is controlled by the controller 400 to accurately generate a driving force at a predetermined magnitude and move the sample holding member 120 up to the upper position. The controller 400 verifies whether the sample holding member 120 is sensed by the upper position sensor 142 during a fourth preset time after the controller 400 sent a control signal to the lifter 112 to move up the sample holding member 120 (S74). If the upper position sensor 142 senses the sample holding member 120 being properly located at the upper position, the automated experiment process is completed.

If the upper position sensor 142 fails to sense the sample holding member 120 during the fourth preset time, the controller 400 stops all the operations of the automated experiment apparatus 10 and generates alarm code 7 (S742). This makes it possible to prevent erroneous operation of the apparatus which may occur when the next experiment is initiated in a state in which the sample holding member 120 is not properly positioned at the upper position due to an unexpected error despite the provision of the predetermined driving force.

Turning now to FIGS. 1 and 7, these figures show the gas transfer unit 130 connected to the sample holding member 120. Specifically, the gas supplier 132 and the gas discharger 136 of the gas transfer unit 130 are connected to the sample holding member 120 via the gas supply line 134 and the gas discharge line 138, respectively, and the gas supply line 134 and the gas discharge line 138 are arranged to go inside the housing 100. However, if such gas lines disposed in the housing 100 are corroded, it would be difficult for an ordinary user to fix the same.

To solve this problem, the automated experiment apparatus 10 according to one embodiment of the present invention may employs a gas control module 500 detachably accommodated in the housing 100, making it easy for an unskilled man to replace gas pipes constituting a part of the gas supply line 134 and the gas discharge line 138. Hereinafter, specific configurations of the gas control module 500 will be described in detail with reference to FIGS. 10 to 13.

Referring to FIGS. 10 to 13, the gas control module 500 is detachably accommodated in the housing 100 and includes gas pipes constituting a part of the gas supply line 134 and the gas discharge line 138 which provide flow paths for the gas supplied to or discharged from the pressure vessel 200. Further, the gas control module 500 also includes various valve devices for controlling a supplying path or a discharging path of the gas.

The gas control module 500 includes a base panel 502, a connecting block 510 connected at one side of the base panel 502, a gas input valve 520 configured to open or close the gas supply line 134, a gas output valve 530 configured to open or close the gas discharge line 138 and a relief valve 540 configured to open a bypass line for a rapid discharging of the gas when the pressure inside the pressure vessel 200 reaches or exceeds the pressure limit.

Moreover, a space for accommodating the gas control module 500 is formed inside the housing 100 and an inner hole 101 (see, FIG. 12) communicating with a lower portion of the housing 100 is formed at the bottom surface of said space.

Further, various lines and connectors extended from the gas control module 500 pass through this inner hole 101, such as an input connector 522 and an output connector 524 respectively extended from the gas supply line 134 and the gas discharge line 138. The input connector 522 and the output connector 524 are connected to connection ports (not shown) of the pressure vessel 200 within the housing 100.

Moreover, the space in the housing 100 where the gas control module 500 is received may be covered by a back cover 103. The back cover 103 is configured to open said space of the housing 100 when the gas control module 500 is being installed in or detached from the housing 100.

The base panel 502 is provided to support pipes for supplying or discharging the gas and may be fixed to the housing 100 by bolts and nuts. Alternatively, the base panel 502 may be detachably attached to the housing 100 and the detaching or attaching of the base panel 502 is guided by the connecting block 510 attached at one side of the base panel 502.

When the base panel 502 is attached to the housing 100, the connecting block 510 is inserted to a connecting groove 102 concavely formed from an edge of a wall of the housing 100 and determines an installing position of the base panel 502. Accordingly, it is easy even for an unskilled person to open the back cover 103 and attach or detach the base panel 502 to or from the housing 100.

Meanwhile, a manual valve 512, an emergency valve 514 and a gas input port 516 are provided to the connecting block 510.

The manual valve 512 may be provided for adjusting a pressure of the gas supplied from the gas supplier 132 such as a gas bombe in a laboratory when the automated experiment apparatus 10 is initially set up in the laboratory. To this end, an initial pressure gauge 504 may be provided to the base panel 502, and the initial pressure gauge 504 is connected to the manual valve 512 so that an installer can check the pressure of the gas when adjusting the initial pressure of the gas. After the initial adjustment of the pressure of the gas is finished, the manual valve 512 may not be touched during the normal operation.

The emergency valve 514 may be used to manually discharge the gas from the pressure vessel 200 when an alarm is generated by the controller 400 during the experiment. For this, the emergency valve 514 is configured to manually open or close a bypass line bypassing the gas output valve 530.

The gas input port 516 is configured to be engaged with the gas supply line 134 extended from the gas supplier 132. Further, a line is extended from the gas input port 516 to the pressure vessel 200.

The gas input valve 520 is installed to the base panel 520 and configured to be provided on the gas supply line 134 when the gas control module 500 is installed in the housing 100. The gas input valve 520 is provided on the line extended from the gas input port 516 so as to open or close the gas supply line 134 and configured to be controlled by the controller 400. For example, the gas input valve 520 may be a solenoid valve which is electrically connected to the controller 400.

Further, the input connector 522 is provided at an end of the line on which the gas input valve 520 is provided. The input connector 522 is connected to an input line extended from the sample holding member 120. The check valve 526 is provided between the gas input valve 520 and the input connector 522, to prevent a gas reflux toward the gas input valve 520.

The gas output valve 530 may be attached to the base panel 502 and located in the middle of the gas discharge line 138 when the gas control module 500 is installed in the housing 100. The gas output valve 530 is provided on the gas discharge line 138 which is extended from the sample holding member 120 and connected to the blower fan 105.

The gas output valve 530 is configured to open or close the gas discharge line 138 and the controller 400 is configured to control the gas output valve 530. For example, the gas discharge valve 530 may be a solenoid valve which is electrically connected to the controller 400.

The relief valve 540 may be attached to the base panel 502 and located in the middle of the bypass line bypassing the gas output valve 530 when the gas control module 500 is installed in the housing 100. Further, the relief valve 540 is configured to open the bypass line only at a pressure exceeding a preset pressure limit such as 200 bar. As a result, if the pressure of the gas inside the pressure vessel 200 or the gas discharge line 138 exceeds the pressure limit, the relief valve 540 is configured to be automatically opened and the gas is discharged therefrom through the relief valve 540. Consequently, an accident can be prevented by opening of the relief valve 540 even when the user failed to open the emergency valve 514. The relief valve 540 can be preset to be opened under a pressure higher than the pressure limit at which the alarm will be also generated by the controller 400.

Meanwhile, the gas discharge line 138 extended from the sample holding member 120 and connected to the blower fan 105 includes at least 3 junctions 532, 534, 536 so that the gas discharge line 138 is separated into at least 3 branches inside the housing 100. Among those flow lines, a first junction 532 is a junction from which a line with the emergency valve 514 provided thereon is branched off and a second junction 534 is positioned on a downstream line of the first junction 532. The second junction 534 is a junction from which a line with the gas output valve 530 provided thereon and a line with the relief valve 540 provided thereon are branched off. Further, the third junction 536 is where the three lines with the emergency valve 514, the gas output valve 530 and the relief valve 540 respectively provided thereon all join together.

Further, a line extended from the third junction 536 is connected to the blower fan 105 so that the gas is discharged by the blower fan 105. The blower fan 105 is connected to a discharge port 107 formed through a wall of the housing 100 to discharge the gas from the housing 100.

Meanwhile, a regular pressure gauge 506 may be provided on the base panel 502 for manually checking the pressure of the gas inside the pressure vessel 200 during the operation of the automated experiment apparatus 10. The regular pressure gauge 506 is connected to a line branched from the middle of a line connecting the second junction 534 and the relief valve 540 so that the pressure inside the pressure vessel 200 can be shown by the regular pressure gauge 506.

According to the gas control module 500 of the present embodiment, during the ordinary operation, the emergency valve 514 and the relief valve 540 are closed, and discharging of the gas is controlled by the gas output valve 530. Further, when the pressure inside the pressure vessel 200 increases over the pressure limit, alarm is generated, and the user can manually manipulate the emergency valve 514 to discharge the gas from the pressure vessel 200 or the relief valve 540 is automatically opened to discharge the gas.

Hereinafter, the steps for installing the gas control module 500 having aforementioned configurations into the housing 100 will be described. When installing the gas control module 500 into the housing 100, the back cover 103 can be opened. After that, the connecting block 510 can be simply inserted into the connecting groove 102. Then, the base panel 502 can be fixed to the housing 100 by bolts. After fixing the base panel 502 to the housing 100, the input connector 522 and the output connector 524 can be connected to the sample holding member 120 or lines extended from the sample holding member 120. Finally, the third junction 536 can be connected to the blower fan 105 via a tube and the back cover 103 can be closed. By those simple steps, pipes and valves inside the housing can be easily installed by installing the gas control module 500 to the housing 100.

According to the automated experiment apparatus and the automated experiment method described above, it is possible to automatically perform an experiment from the beginning to the end. As a result, it is possible to reduce a risk of gas leakage and human exposure to a harmful gas due to a manual operation. Further, it is possible to make it easier to replace members provided for transferring the gas for maintenance.

Furthermore, the resultant values detected by various kinds of sensors are utilized during the course of the automated experiment process. In the case where damage or erroneous operation of the apparatus is likely to occur, the process is stopped and different alarm codes are generated depending on the situation. This enables the user to recognize the situation and to take an appropriate measure. It is therefore possible to prevent irrecoverable damage or erroneous operation of the apparatus.

While specific embodiments of the present disclosure have been described above, these embodiments are just one example, and the present disclosure is not limited thereto. The present disclosure shall be construed to have a broadest scope according to the basic idea disclosed herein. A person skilled in the art may derive modifications not disclosed herein by combining or substituting the disclosed embodiments. These modifications fall within the scope of the present disclosure. In addition, a person skilled in the art may easily change or modify the disclosed embodiments based on the subject specification. It is apparent that such changes or modifications also fall within the scope of the present disclosure.

What is claimed is:

1. An automated experiment apparatus, comprising:
   a pressure vessel having an opening to define a sample receiving chamber therein, the pressure vessel including a vessel flange having a circular outer shape with a radius about a central axis of the pressure vessel;
   a sample holding member configured to hold a sample to be accommodated in the sample receiving chamber, the sample holding member including a holder flange having an outer circular shape of the same radius as the vessel flange and configured to make contact with the vessel flange to close the opening;
   a sensing unit configured to sense at least one of an upper position and a lower position of the sample holding member;
   a plurality of clamps configured to air-tightly engage the holder flange of the sample holding member and the vessel flange of the pressure vessel wherein each of the plurality of clamps includes a clamp head having a groove configured to engage with the holder flange and the vessel flange and an actuator connected to the clamp head;
   a clamping sensor configured to sense a top dead point of the clamp head at which the clamp head is fully pushed out by the actuator to air-tightly engage the holding flange;
   a gas transfer unit having a gas supplier and a gas discharger connected to the sample holding member and configured to supply or discharge a gas into or from the pressure vessel;

a heating unit configured to heat the sample receiving chamber;
a pressure sensor configured to measure an internal pressure of the pressure vessel;
a user interface configured to receive an input from an user; and
a controller configured to receive the input signal from the user interface and the sensing signal from a sensing unit to control in response to the input signal and the sensing signal, the actuator of each of the clamps to cause the clamp head to make a transverse movement in a radial direction of the vessel flange to engage the holder flange and the vessel flange to engage the holder flange and the vessel flange, to control in response to a clamping sensor signal received from the clamping sensor, the gas transfer unit to supply the gas to the pressure vessel until the internal pressure of the pressure vessel reaches a predetermined reaction pressure as indicated by a pressure sensor signal from the pressure sensor, to control in response to the pressure sensor signal from the pressure sensor, the heating unit to heat the sample receiving chamber, and to control the gas transfer unit to discharge the gas from the sample receiving chamber.

2. The apparatus of claim 1, wherein the controller comprises:
a processor,
a memory coupled to the processor, and
an interfacing circuit coupled to the processor, the interfacing circuit further coupled to the user interface and the sensing unit to receive the input signal and the sensing signal therefrom, the interfacing circuit also coupled to the clamping sensor to receive a sensor signal therefrom, and the actuator of each of clamps to send control signals to actuators to control operations of the actuators.

3. The apparatus of claim 2, further comprising:
a lifter;
a moving frame connected to the sample holding member and the lifter; and a guide configured to guide movement of the moving frame,
wherein the interfacing circuit is configured to send a control signal to the lifter to move the moving frame vertically.

4. The apparatus of claim 2, further comprising:
wherein the interfacing circuit is configured to send control signal to the gas supplier to supply the gas to the sample receiving chamber, and
wherein the interfacing circuit is configured to send control signal to the gas discharger to discharge the gas from the sample receiving chamber.

5. The apparatus of claim 2, wherein the sensing unit comprises an upper position sensor configured to sense whether the sample holding member is located at the upper position and a lower position sensor configured to sense whether the sample holding member is located at the lower position,
wherein the upper position sensor is coupled to the sensor signal receiving unit and configured to send a sensing signal of whether the sample holding member is located at the upper position to the sensor signal receiving unit, and
wherein the lower position sensor is coupled to the sensor signal receiving unit and configured to send a sensing signal of whether the sample holding member is located at the lower position to the sensor signal receiving unit.

6. The apparatus of claim 2, wherein the controller is configured to automatically perform a reaction process under a predetermined temperature and a predetermined pressure when the sample holding member is air-tightly fixed to the pressure vessel.

7. The apparatus of claim 1, wherein the holder flange and the vessel flange have a ring shape, and the groove has a C-like vertical cross section.

8. The apparatus of claim 1, wherein a vertical cross section of the groove is defined by a vertical surface and two slant surfaces formed to extend from upper and lower ends, respectively, of the vertical surface.

9. The apparatus of claim 1, further comprising:
a housing wherein the pressure vessel is provided; and
a gas control module detachably accommodated in the housing, wherein the gas control module comprises:
a base panel supporting pipes for supplying the gas to or discharging the gas from the pressure vessel, wherein the base panel is detachably accommodated to the housing;
a connecting block attached at one side of the base panel;
a gas input valve provided on the base panel to open or close a gas supply line for supplying the gas to the pressure vessel; and
a gas output valve provided on the base panel to open or close a gas discharge line for discharging the gas from the pressure vessel.

10. The apparatus of claim 9, wherein the connecting block is inserted into a connecting groove recessed on an edge of a wall of the housing,
wherein the connecting block determines a position of the base panel when the gas control module is accommodated in the housing.

11. The apparatus of claim 9, wherein the gas control module further comprises a relief valve provided on the base panel and automatically opened when a pressure in the pressure vessel is equal to or higher than a predetermined pressure,
wherein an emergency valve is provided on the connecting block, configured to be manipulated manually, and located on a middle of the gas discharge line, and
wherein the gas discharge line includes at least three branches in the gas control module, and wherein the emergency valve, the gas output valve and the relief valve are respectively provided on each of the three branches.

12. An automated experiment method using an automated experiment apparatus, comprising:
moving a sample holding member of the automated experiment apparatus down to make a holder flange of the automated experiment apparatus contact with a vessel flange of the automated experiment apparatus by driving a lifter in response to a control signal sent by a controller of the automated experiment apparatus, wherein the sample holding member is configured to hold a sample to be accommodated in a sample receiving chamber of the automated experiment apparatus;
engaging the holder flange and the vessel flange to air-tightly fix a sample holding member and a pressure vessel of the automated experiment apparatus by the controller sending control signals to actuators of the automated experiment apparatus to move clamp heads of clamps the automated experiment apparatus transversely toward the holder flange and the vessel flange;
supplying a gas to a sample receiving chamber of the automated experiment apparatus until the internal pressure of the pressure vessel reaches a predetermined reaction pressure as indicated by a pressure sensor signal from a pressure sensor;

heating the sample receiving chamber after supplying the gas to the sample receiving chamber;

cooling the sample receiving chamber by circulating a coolant along a periphery of the sample receiving chamber after a reaction inside the sample receiving chamber is finished;

discharging the gas from the sample receiving chamber;

disengaging the holder flange and the vessel flange by the controller sending control signals to the actuators to move the clamp heads transversely away from the holder flange and the vessel flange; and moving the sample holding member up by driving the lifter in response to the control signal sent by the controller.

13. The method of claim 12, wherein the automated experiment apparatus comprises a sensing unit includes an upper position sensor sensing whether the sample holding member is located at an upper position and a lower position sensor sensing whether the sample holding member is located at a lower position, wherein if the upper position sensor fails to sense the sample holding member located at the upper position before the sample holding member starts to move down, the controller stops all operations of the automated experiment apparatus and generates a first alarm, and wherein if the lower position sensor fails to sense the sample holding member located at the lower position during the first preset time after the controller sent the control signal to the lifter to move down the sample holding member, the controller stops all operations of the automated experiment apparatus and generates a second alarm.

14. The method of claim 13, wherein each of the clamps includes a clamping sensor sensing a position of the clamp head, and wherein if at least one of the clamping sensors fails to sense the corresponding clamp head positioned at a top dead point during a second preset time after the controller sent control signals to the actuators for stretching thereof, the controller stops all operations of the automated experiment apparatus and generates a third alarm.

15. The method of claim 14, wherein if the clamping sensor fails to sense the clamp head positioned at a bottom dead point during a third preset time after the controller sent control signals to the actuators for shrinking thereof, the controller stops all operations of the automated experiment apparatus and generates a fourth alarm.

16. The method of claim 15, wherein the automated experiment apparatus includes a pressure sensor configured to measure an internal pressure
of the pressure vessel, and wherein during the supplying, if the internal pressure measured by the pressure sensor reaches a pressure limit, the controller stops all operations of the automated experiment apparatus and generates a fifth alarm.

17. The method of claim 16, wherein the automated experiment apparatus includes a temperature sensor configured to measure an internal temperature of the pressure vessel, and wherein during the heating, if the internal temperature measured by the temperature sensor reaches a temperature limit, the controller stops all operations of the automated experiment apparatus and generates a sixth alarm.

18. The method of claim 17, wherein if the upper position sensor fails to sense the sample holding member located at the upper position during a fourth preset time after the controller sent a control signal to the lifter to move up the sample holding member, the controller stops all operations of the automated experiment apparatus and generates a seventh alarm.

* * * * *